(12) United States Patent
Goto et al.

(10) Patent No.: US 7,311,796 B2
(45) Date of Patent: Dec. 25, 2007

(54) PLASMA PROCESSING APPARATUS

(75) Inventors: Masashi Goto, Yokohama (JP); Yukihiko Nakata, Nara (JP); Kazufumi Azuma, Yokohama (JP); Tetsuya Okamoto, Kamakura (JP)

(73) Assignee: Kabushiki Kaisha Ekisho Sentan Gijutsu Kaihatsu Center (JP)

( * ) Notice: Subject to any disclaimer, the term of this patent is extended or adjusted under 35 U.S.C. 154(b) by 229 days.

(21) Appl. No.: 10/681,615

(22) Filed: Oct. 8, 2003

(65) Prior Publication Data

US 2004/0071613 A1 Apr. 15, 2004

(30) Foreign Application Priority Data

Oct. 9, 2002 (JP) .............................. 2002-295590
Aug. 8, 2003 (JP) .............................. 2003-290428

(51) Int. Cl.
*H01L 21/306* (2006.01)
*C23C 16/00* (2006.01)
*C23C 14/34* (2006.01)

(52) U.S. Cl. .......................... 156/345.36; 156/345.41; 118/723 MW; 118/723 ME; 118/723 MR; 118/723 AN; 204/298.38

(58) Field of Classification Search ........ 118/723 MN, 118/723 ME, 723 MR, 723 AN; 156/345.36, 156/345.41; 204/298.38
See application file for complete search history.

(56) References Cited

U.S. PATENT DOCUMENTS

| | | | | | |
|---|---|---|---|---|---|
| 2,632,809 | A | * | 3/1953 | Riblet | ......................... 333/113 |
| 4,294,678 | A | * | 10/1981 | Kuehnle | ................. 204/192.12 |
| 5,134,965 | A | * | 8/1992 | Tokuda et al. | ...... 118/723 MW |
| 5,415,719 | A | * | 5/1995 | Akimoto | ................. 156/345.38 |
| 5,698,036 | A | * | 12/1997 | Ishii et al. | .......... 118/723 MW |
| 5,951,887 | A | * | 9/1999 | Mabuchi et al. | ........ 219/121.43 |
| 6,189,481 | B1 | * | 2/2001 | Akimoto | ............. 118/723 MW |
| 6,290,807 | B1 | * | 9/2001 | Matsumoto et al. | ... 156/345.41 |

FOREIGN PATENT DOCUMENTS

| | | |
|---|---|---|
| EP | 0831680 A1 | 3/1998 |
| JP | 08-111297 | 4/1996 |
| JP | 2001-203099 * | 7/2001 |
| KR | 1999-014799 | 2/1999 |

OTHER PUBLICATIONS

Machine translation of Noguchi (2001-203099).*

* cited by examiner

*Primary Examiner*—Rodney G. McDonald
(74) *Attorney, Agent, or Firm*—Graybeal Jackson Haley LLP (57) ABSTRACT

A plasma processing apparatus comprises: a chamber 12 having at least one opening and for generating plasma; a dielectric member 14 provided to cover the opening airtightly; at least one wave guide 16 provided in the exterior of the chamber such that the one end side opposes the dielectric member; an electromagnetic wave source 20 provided on the other end side of the wave guide; a plurality of holes 38, 40, 42, 44, 46 provided on a surface opposing the dielectric member of the wave guide; and hole area adjusting means 18 provided in at least one of the above-mentioned holes so as to adjust the opening area of the hole.

8 Claims, 5 Drawing Sheets

PLASMA PROCESSING APPARATUS

Priority is claimed to Japanese patent application No. 2003-290428, filed 8 Aug. 2003, and to Japanese patent application No. 2002-295590, filed 9 Oct. 2002, which are incorporated by reference.

BACKGROUND OF THE INVENTION

1. Field of the Invention

The present invention relates to a plasma processing apparatus, and more particularly, to an apparatus for performing plasma processing for thin film deposits, surface treatment, etching, etc. to be performed during a process of production of semiconductor devices, liquid crystal display devices, etc.

2. Description of Prior Art

There is a plasma processing apparatus which generates plasma by an electromagnetic wave generated in an electromagnetic wave oscillator, particularly a microwave generator, introducing it into a plasma generating chamber through a window of a dielectric by a wave guide, and exciting molecules of processed gas supplied into the plasma generating chamber. In the tube wall of the wave guide in contact with the plasma generating chamber, a plurality of holes for introducing the microwave into the plasma generating chamber are formed.

Plasma is generated in the plasma chamber after the microwave is introduced. The radiated amount of electromagnetic wave energy from respective holes are equalized, in order to make plasma of a uniform distribution generated within the plasma generating chamber, for example, by forming beforehand the area of a hole on the terminal end side of the wave guide larger than those of the other holes, thereby controlling so that the radiated amount of the electromagnetic wave energy from respective holes may not become uneven by reflection of the electromagnetic wave on the terminal end side of the wave guide (e.g., see Patent Document 1).

[Patent Document 1] Japanese Patent Appln. Public Disclosure No. 8-111297 Official Gazette (pp. 2-6 and FIG. 2)

Actually, however, even if the electromagnetic wave from the respective holes are equally radiated, there still remained a problem that the plasma distribution within the plasma generating chamber was not uniform. This was because the plasma density around the center of the plasma generating chamber and the plasma density in the neighborhood of its chamber wall were not equal, and because the extent of variation in the radiated amount of the electromagnetic wave energy from respective holes are different according to the kinds of gas introduced into the plasma generating chamber.

In the neighborhood of the plasma generating chamber wall, the amount of extinction of plasma is great for the amount of generation of plasma, and the plasma density is low, which causes a dispersion in plasma density in the plasma generating chamber. Also, the extent of this dispersion is changed by the radiated amount of electromagnetic wave energy from respective holes depending on the kinds of introduced gas elements.

To solve this problem, it was necessary to prepare a chamber having a specific shape capable of dissolving the dispersion in plasma density within the plasma generating chamber or a plurality of specific chambers adapted to the kinds of introduced gas elements.

SUMMARY OF THE INVENTION

Embodiments of the invention provide a plasma processing apparatus adapted to uniform the plasma density within a chamber for generating the plasma, without necessitating a specific chamber having a specific shape.

A plasma processing apparatus according to the present invention comprises: a chamber defining at least one opening and constructed for retaining a plasma; a dielectric member positioned to sealingly cover the at least one opening; at least one wave guide provided exteriorly of the chamber such that its one end side thereof opposes the dielectric member; an electromagnetic wave source operatively coupled to the at least one wave guide; a plurality of holes defined by a side of the least one wave guide that is in opposition to the dielectric member of the wave guide; and hole area adjusting means including a reciprocatable plate portion provided in at least one of the holes so as to adjust the opening area of the at least one hole, and therby modulate the waveform of a propagating wave during operation thereof.

Preferably, the hole having the hole area adjusting means has a larger hole area than those of the other holes.

The hole having the largest hole area may be located at the terminal end side of the wave guide.

Preferably, the wave guide is constituted by a plurality of wave guides.

At least one of the above-mentioned holes may be located near the periphery of the dielectric member.

It can be constituted such that the wave guide has a rectangular cross-sectional shape, the hole has four sides of a rectangle, the dielectric members has four sides of a rectangle, and that the longer sides of the hole is parallel to one side of the dielectric member close thereto.

Preferably, the hole area of the hole on the side of the chamber side wall surface is made the largest, and this hole is provided with the hole area adjusting means.

Preferably, the hole area adjusting means is adapted to adjust the opening area of the hole by reciprocating a metal plate-like portion.

Another plasma processing apparatus according to the present invention comprises: a plasma chamber having at least one opening; a dielectric member having four sides of a rectangle-like shape providing so as to air-tightly cover the opening; at least one wave guide provided to oppose the dielectric member; and a plurality of holes provided on a surface opposing the dielectric member of the wave guide and having four sides of a rectangle; wherein the area of the hole on the side of the side wall of the chamber are made larger than the areas of the other holes.

Yet another plasma processing apparatus according to the present invention comprises: a chamber having at least one opening; a dielectric member having four sides of a rectangle-like shape and provided to cover the opening airtightly; at lease one wave guide having a rectangular cross-sectional shape and provided in the exterior of the chamber so as to oppose the dielectric member; and at least one hole having four sides of a rectangle-like shape and formed in the wave guide so as to oppose the dielectric member, wherein one side of the hole and one side of the dielectric member are parallel.

Preferably, at least one hole located near one of two adjoining sides of the dielectric member and at least one hole located near the other of the two sides are included, wherein the long side of the hole located in the neighborhood of one of the two sides is parallel to the one, while the long sides of the hole located near the other of the two sides are parallel to the other.

The plasma density within the plasma generating chamber can be uniformed.

BRIEF DESCRIPTION OF THE DRAWINGS

In the drawings:

FIGS. 1a and 1b are views schematically showing an embodiment of the plasma processing apparatus according to the present invention, in which

FIGS. 3a and 3b are views schematically showing yet another embodiment of the plasma processing apparatus according to the present invention, in which

FIGS. 4a and 4b are views schematically showing an embodiment of the other plasma processing apparatus according to the present invention, in which

PREFERRED EMBODIMENT OF THE INVENTION

Figure 1A:
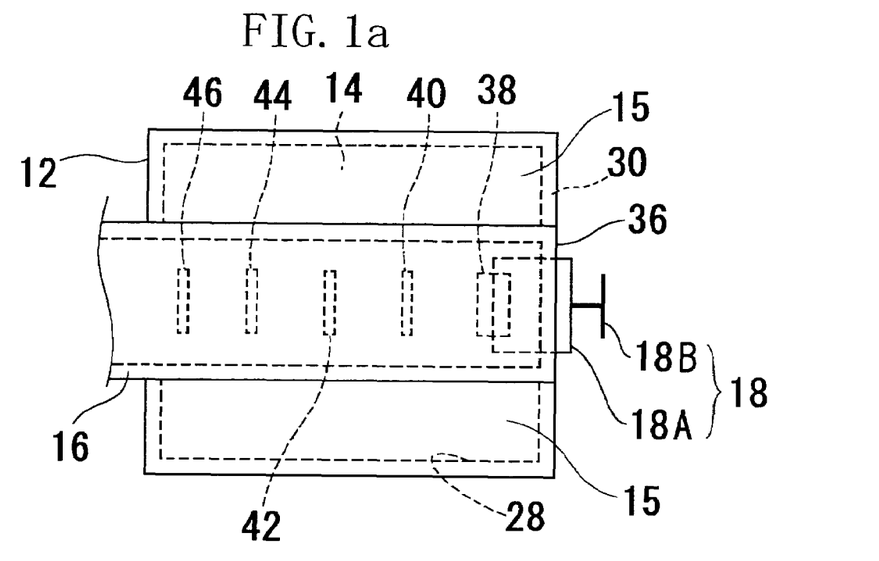
FIG. 1a is a plan view of the main portion, and FIG. 1b a side view with a part shown in cross section.
Figure 1B:
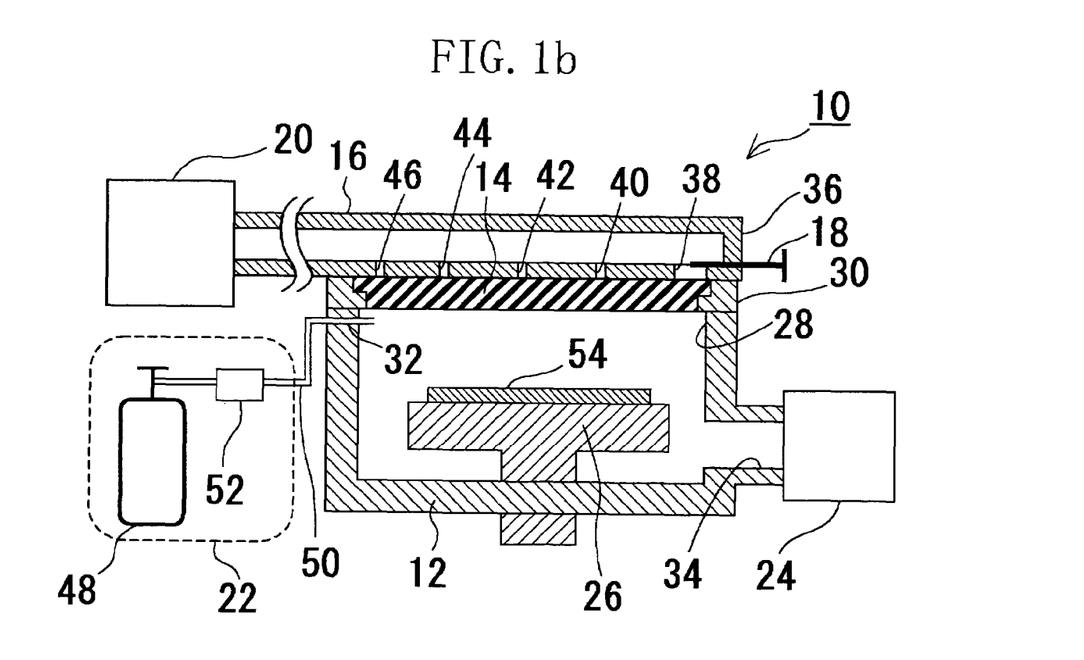

Referring to FIGS. 1a and 1b, the plasma processing appatus according to the present invention is shown by reference numeral 10 as a whole. The plasma processing apparatus 10 comprises a plasma generating chamber 12, a dielectric member 14, a wave guide 16, and a hole area adjusting means 18. The plasma processing apparatus 10 can further comprise an electromagnetic wave source, e.g., a microwave oscillator 20, a gas introducing apparatus 22, a gas vaccum system 24, and a sample support stand 26. Metal lid 15 covers the dielectric member 14 and attaches to the plasma generating chamber 12 to prevent the leak of the microwave from the dielectric member 14.

The plasma processing apparatus 10 is used, for example, as a apparatus for ashing by oxygen plasma. By the oxygen plasma generated in a plasma generating chamber 12, it is possible, for example, to perform decomposition or peeling of photo resist on a substrate for liquid crystal panel, that is, ashing. Also, the plasma processing apparatus 10 is used as an apparatus for etching with chlorine or fluorine gas or for plasma CVD with mono-silane gas, ammonia gas, methane gas and so forth.

The plasma generating chamber 12 which is the chamber for generating the plasma is preferably to keep its vacuum. The plasma generating chamber 12 has at least one opening 28 as an electromagnetic wave window in the wall surface, e.g., the top cover portion of the chamber 12. A window frame 30 defining the opening 28 is attached to the plasma generating chamber 12 to keep the vaccum. The plasma generating chamber 12 also has an opening 32 for introducing gas and an opening 34 for evacuating gas.

The dielectric member 14 covers air-tightly the opening 28 provided in a position corresponding to, for example, the top cover portion of the plasma generating chamber 12, and is attached to the window frame 30 with a rubber 0 ring to keep the vacuum of the plasma generating chamber. As the dielectric member 14, quartz, ceramic and the like which enable the electromagnetic wave to transmit can be used.

As the wave guide 16, a metal pipe for transmitting the electromagnetic wave, particularly a microwave, can be used. The microwave oscillator 20 is coupled with one end of the wave guide 16, and the wave guide 16 transmits the electromagnetic wave outputted from the microwave oscillator 20. In the illustration, the wave guide 16 is made of aluminum. Also, the wave guide 16 has a rectangular cross-sectional shape. The wave guide 16 is in the exterior of the plasma generating chamber 12, and the other end side of the wave guide 16 opposes the dielectric member 14 to be in contact therewith to face it. In the illustration, an end portion 36 of the wave guide 16 is positioned substantially above the window frame 30. The wave guide 16, having a width space narrower than the metal top cover portion of the plasma generating chamber 12 and about the same length of the metal top cover portion, is located in the central portion of the plasma generating chamber 12.

In the wave guide 16, there are provided a plurality of holes 38, 40, 42, 44, 46 opening to confront the dielectric member 14. That is to say, these holes 38, 40, 42, 44, 46 are provided in the surface opposing the dielectric member 14 of the wave guide 16. In the illustration, each of holes 38, 40, 42, 44, 46 has four sides of a rectangle, and the short side of the hole 38 located on the terminal end side of the wave guide 16 is longer than each short side of the other holes 40, 42, 44, 46. The hole 38 has a larger hole area in comparison with the other holes 40, 42, 44, 46, and the other holes 40, 42, 44, 46 have about the same shape. In place of this example, the holes 38, 40, 42, 44, 46 may be formed to have a planar configuration such as polygonal, circular, elliptical shapes, other than a rectangle. In such a case, however, it is less efficient in supplying the microwave into the plasma generating chamber 12. The shape of the holes may be any shape, for example, circular instead of rectangular.

In the illustration, the open surfaces of the holes 38, 40, 42, 44, 46 of the wave guide 16 are perpendicular to the electric field plane within the wave guide 16 and parallel to the magnetic field plane. While the holes 38, 40, 42, 44, 46 can be formed at arbitrary intervals, they are preferably at equal intervals at every half a wavelength of the microwave. The hole area adjusting means 18 is means for adjusting the amount of radiation of the microwave which passes adjusted holes and radiates into the plasma generating chamber 12, and adjusts the opening areas of the holes to adjust this amount of radiation.

The hole area adjusting means 18 is to adjust the opening area of the hole 38, and has, for example, a plate-like portion 18A which is substantially rectangular in planar configuration. The area of the plate-like portion 18A is, as described later, desirably larger than the area of a hole to which the hole area adjusting means 18 is applied. The plate-like portion 18A is a member which is made from non-transmittance material to an electromagnetic wave such as a microwave, and is the most suitably made of a metal material such as, for example, aluminum, copper or the like. In the illustration, the plate-like portion is composed of an aluminum plate like the wave guide 16.

The plate-like portion 18A of the hole area adjusting means 18 is attached to the wave guide 16 so as to reciprocate. A reciprocation mechanism 18 consists of the plate-like portion 18A with, for example, an operation rod 18B extending outward, and this operation rod 18B reciprocally operated. The operation rod 18B can be engaged with a motor not shown to be automatically operated by remote control.

The hole area adjusting means 18 is desirably provided, for example, in the holes 38, 40, 42, 44, 46 where the plasma is less uniform. In this embodiment, the hole area adjusting means 18 is provided in the hole 38 located at the farthest position from the microwave oscillator 20. The hole 38 is preferably given a larger area than the areas of the other holes, but it may have an equal area to those of the other holes 40, 42, 44, 46. To compare the areas of the holes 38, 40, 42, 44, 46, only the area of the hole 38 is made larger in this embodiment.

The hole 38, being located at the terminal end portion where a free traveling wave and a reflected wave exist, is formed to have a large area for taking matching. When a volume of the plasma generating chamber 12 is large for a large liquid crystal display substrate, it is desirable that, the farther from the microwave oscillator 20, the larger hole area of the holes 38, 40, 42, 44, 46 be given.

This is because, the farther from the microwave oscillator 20, the less the amount of reaching of the microwave becomes, so that, by broadening the areas of the opening of the holes 46, 44, 42, 40, 38 in this order, the plasma density generated within the plasma generating chamber can be made uniform.

In the illustration, the hole area adjusting means 18 is applied to the hole 38 which has the largest area, and the plate-like portion 18A has longer long sides and short sides than those of the hole 38.

The hole area adjusting means 18 is supported in the wave guide 16 by a guide member (not shown) so as to reciprocate rightward and leftward in the drawing.

The plate-like portion 18A of the hole area adjusting means 18 can be moved to and fro, in the illustration, by manually holding a handle attached to the plate-like portion 18A and positioned outside the wave guide 16. In place of the manual operation, the plate-like portion 18A of the hole area adjusting means 18 may be moved to and fro, for example, by using a stepping motor. Further, in order to make feedback control of the amount of movement of the plate-like portion 18A, it is possible, by monitoring the return amount of the microwave which returns from the plasma generating chamber 12 through the hole 38 to obtain the amount of movement of the plate-like portion 18A. For adjusting the opening area of the hole, it is possible, as mentioned later, to apply the hole area adjusting means 18 to all or part of the other holes 40, 42, 44, 46, or to apply to one of the holes 40, 42, 44, 46, in place of the hole 38.

The microwave oscillator 20, being connected to the end portion of the other end side of the wave guide 16, generates the microwave to be introduced and transmitted into the wave guide 16.

A gas supplier 22 includes: a gas cylinder 48 containing a gas for plasma generation; a pipe 50 for introducing gas into the plasma generating chamber 12; and a flow rate controller 52 attached to an intermediate portion of the pipe 50 and controlling the amount of the gas inflow from the gas cylinder 48 into the plasma generating chamber 12. The pipe 50 is attached to the wall portion of the plasma generating chamber 12 so as to keep the air-tightness within the plasma generating chamber 12.

A vaccum system 24 controls the evacuation of the gas within the plasma generating chamber and its amount.

Sample supporter means 26 fixes and supports a sample 54 in the plasama generating chamber 12.

In the plasma processing apparatus 10, by covering a part of the hole 38 by moving the plate-like portion 18A of the hole area adjusting means 18 to and fro, the size of the opening area of the hole 38 is adjusted, so that the radiation amount of the electromagnetic wave energy from the hole 38 is adjusted.

As a result, the plasma density of a space in the plasma generating chamber 12 below the hole 38 is controlled, and the dispersion in plasma density within the plasma generating chamber is reduced.

Also, by adjusting the size of the opening area of the hole 38 according to the kinds of gas elements to be introduced into the plasma generating chamber 12, the dispersion in radiation amount of the electromagnetic wave energy from the hole 38 is reduced.

The plasma density is a density of an electrically charged particles such as ion or electron and depends on the amount of generation and extinction of plasma. The amount of generation of plasma depends on an electric field strength, i.e., electric power of the electromagnetic wave (in the illustration, the microwave) supplied into the plasma generating chamber 12, and by supplying an electromagnetic wave with uniform electric field strength into the plasma generating chamber 12, uniform plasma is generated. On the other hand, the amount of extinction of plasma depends on diffusion (movement to a space of low plasma density), recombination (recombination of plasma-decomposed particles), surface reaction (reaction on a solid surface including the inner wall of the plasma generating chamber 12), and the like. Therefore, in the neighborhood of the inner wall of the plasma generating chamber 12, the amount of plasma generation is the same, but the amount of extinction of plasma, particularly, the amount of extinction due to surface reaction is greater than it at the central space not near the inner wall. As a result, the plasma density is reduced.

In the illustration, because the holes 38 and 46 are close to the inner wall of the plasma generating chamber 12 and the propagation amount of the microwave is the minimum, it is possible to compensate its extinction and to increase the amount of plasma generation in the neighborhood of the plasma generating chamber 12 by increasing the opening area of the hole 38 by using the hole area adjusting means 18. Then a difference in plasma density between the center of the plasma generating chamber 12 and the neighborhood of the inner wall can be reduced. Here, the hole close to the inner wall of the plasma generating chamber 12 means a hole in a position deviated from the central position of the plasma generating chamber 12 to any of the four inner walls of the plasma generating chamber. The central position means the position at an equal distance from the four inner walls of the plasma generating chamber 12.

Further, in the illustration, since the hole 38 is located at the terminal end side of the wave guide 16, adjustment of the opening area of the hole 38 by the hole area adjusting means 18 enables to control disturbance and variation of the waveform of the electromagnetic wave due to reflection of the electromagnetic wave at the terminal end side of the wave guide 16. And, it enables to control the variation of the amount of plasma generation, thereby it makes the plasma density uniform.

With reference to FIG. 1, it has been explained that the hole area adjusting means 18 is to be applied to the hole 38, but in place thereof, it is possible to make the hole area of the hole 46 larger than them of the other holes 38, 42, 44, 46 so as to apply the hole area adjusting means 18 to the hole 46. Further, the hole areas of the holes 38, 46 may be made larger than them of the other holes 42, 44, 46 so as to apply the hole area adjusting means 18 to each of the holes 38, 46.

Also, the hole area adjusting means 18 may be applied to at least one of the holes 40, 42 and 44 or all the holes 38, 40, 42, 44 and 46. In the embodiment in FIG. 1, the width of one wave guide 16 is narrow in comparison with the size of the plasma generating chamber 12, which may cause the more obstacle in the uniformity of the plasma density. In this case, a plurality of wave guides may be provided to uniform. In the following, this embodiment is explained.

Figure 2:
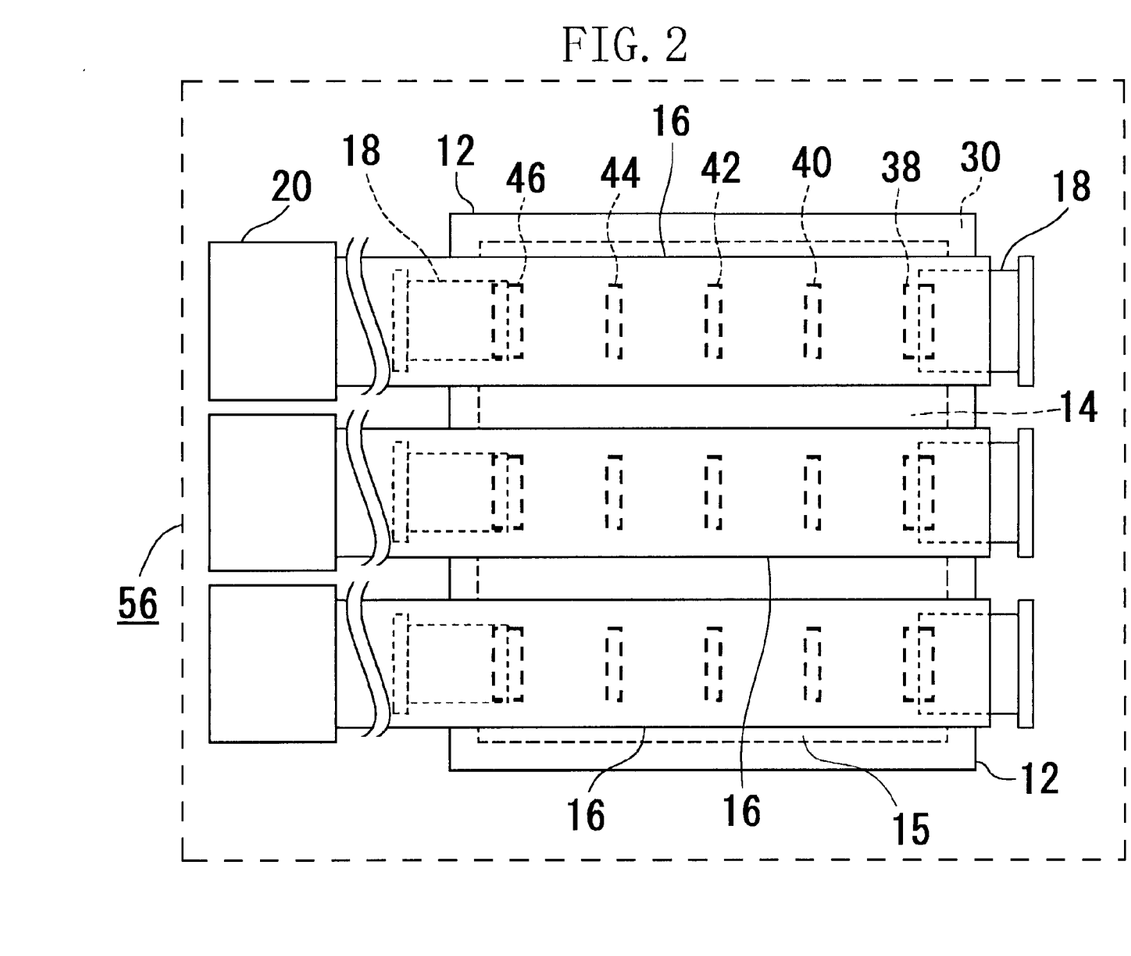
FIG. 2 is a plan view schematically showing another embodiment of the plasma processing apparatus according to the present invention.

Referring to FIG. 2, another plasma processing apparatus 56 is shown. For the same parts as in FIG. 1, the same reference numeral is put, and detailed explanation thereof is omitted for being redundant. FIG. 2 shows a top plan view. The plasma processing apparatus 56 comprises three wave guides 16, 16, 16. In the embodiment in FIG. 2, in comparison with the embodiment in FIG. 1, the more wave guides and holes for radiating the microwave into the plasma generating chamber 12 are provided, and since the microwave is generally radiated in the plasma generating chamber 12, the distribution of the plasma generated in the plasma generating chamber 12 becomes further uniform.

Also, in the embodiment in FIG. 2, the area of the hole 46 besides that of the hole 38 is made larger than them of the other holes 40, 42, 44, and the hole area adjusting means 18 is applied to each of the holes 38, 46, so that the distribution of the plasma density become more uniform.

The number of the wave guides 16 is not limited to the above examples. The number of wave guides 16 (3 in the illustration) can be adjusted to suit the size of the plasma generating chamber 12. Also, while an example of three wave guides 16, 16, 16 having the same size has been explained, it is possible to array wave guides of different sizes to make the plasma density uniform.

Figure 3A:
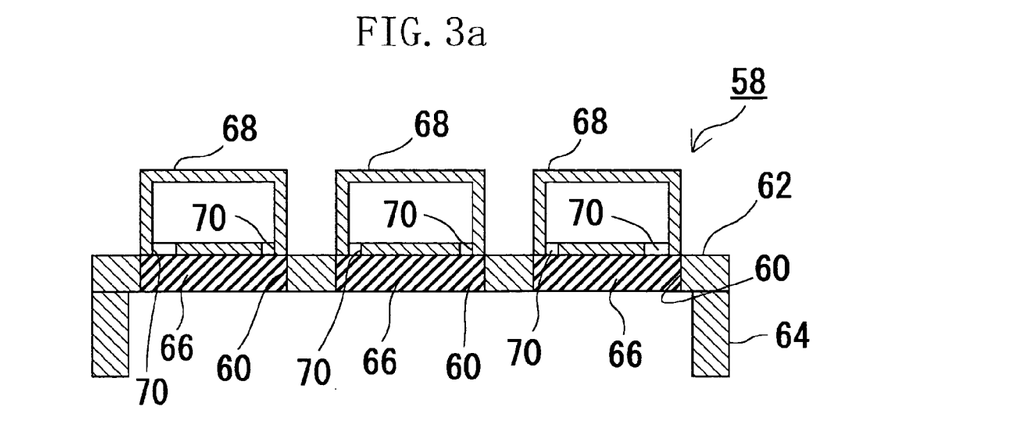
FIG. 3a is a sectional view of the main portion, and FIG. 3b a plan view of the main portion.
Figure 3B:
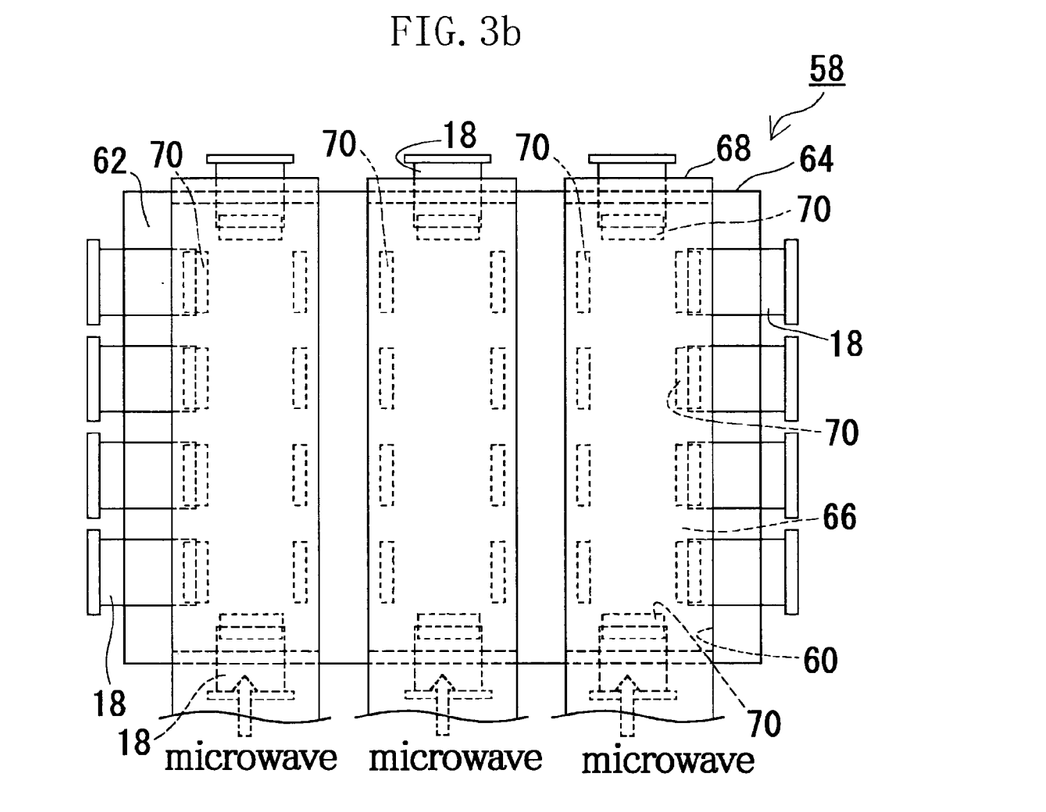

Next, the plasma processing apparatus 58 of another example which is shown in FIGS. 3a and 3b, comprises a plasma generating chamber 64 to which a window frame 62 having three rectangular windows 60, and three dielectric members 66 having four sides of a rectangle-like shape attached so as to keep the air-tightness. Incidentally, the window frame 62 forms a part of the plasma generating chamber 64.

Three wave guides 68 respectively in contact with the three dielectric members 60 are disposed. Each wave guide 68 has a rectangular cross-sectional shape.

Each wave guide 68 has a plurality of holes 70 with four sides of a rectangle. The longer sides of each hole 70 are parallel to one side of the dielectric member 66 close thereto. In the illustration, the wave guide 68 having a rectangular cross-sectional shape, the open plane of the hole 70 is a perpendicular to the wave plane of the electric field in the wave guide 68 and parallel to the wave plane of the magnetic field. Therefore, a loss of the electromagnetic energy near the periphery of the dielectric member 66 is reduced. Here, the hole close to the dielectric member 66 means a hole at a position deviated to any of the four sides of the dielectric member 66. The central position means a position at an equal distance from the four sides of the dielectric member 66, that is, from the two long sides and two short sides.

Also, to each of all the holes 70 close to the inner wall of the plasma generating chamber 64, the hole area adjusting means 18 as explained in FIG. 1 is applied to reduce lowering of the plasma density near the inner wall of the plasma generating chamber 64. As a result, the plasma density of the plasma generated in the plasma generating chamber 64 is made uniform.

Figure 4A:
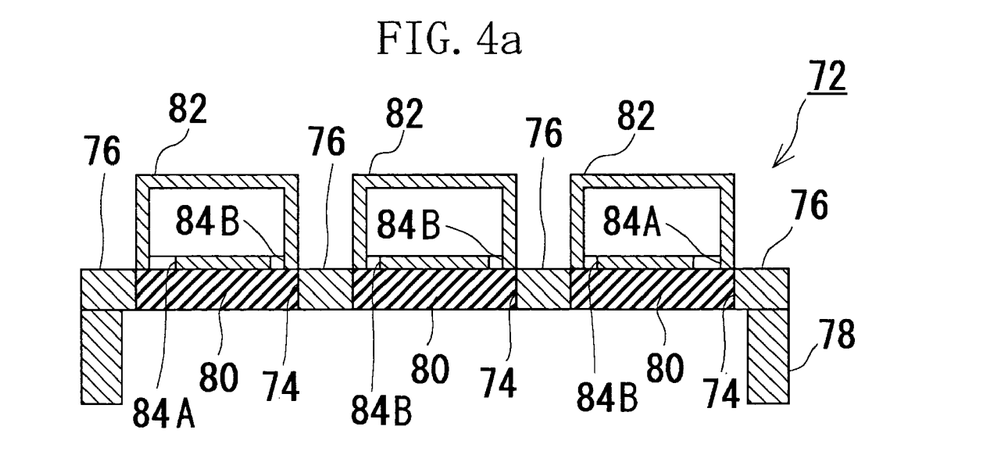
FIG. 4a is a sectional view of the main portion, and FIG. 4b a plan view of the main portion.
Figure 4B:
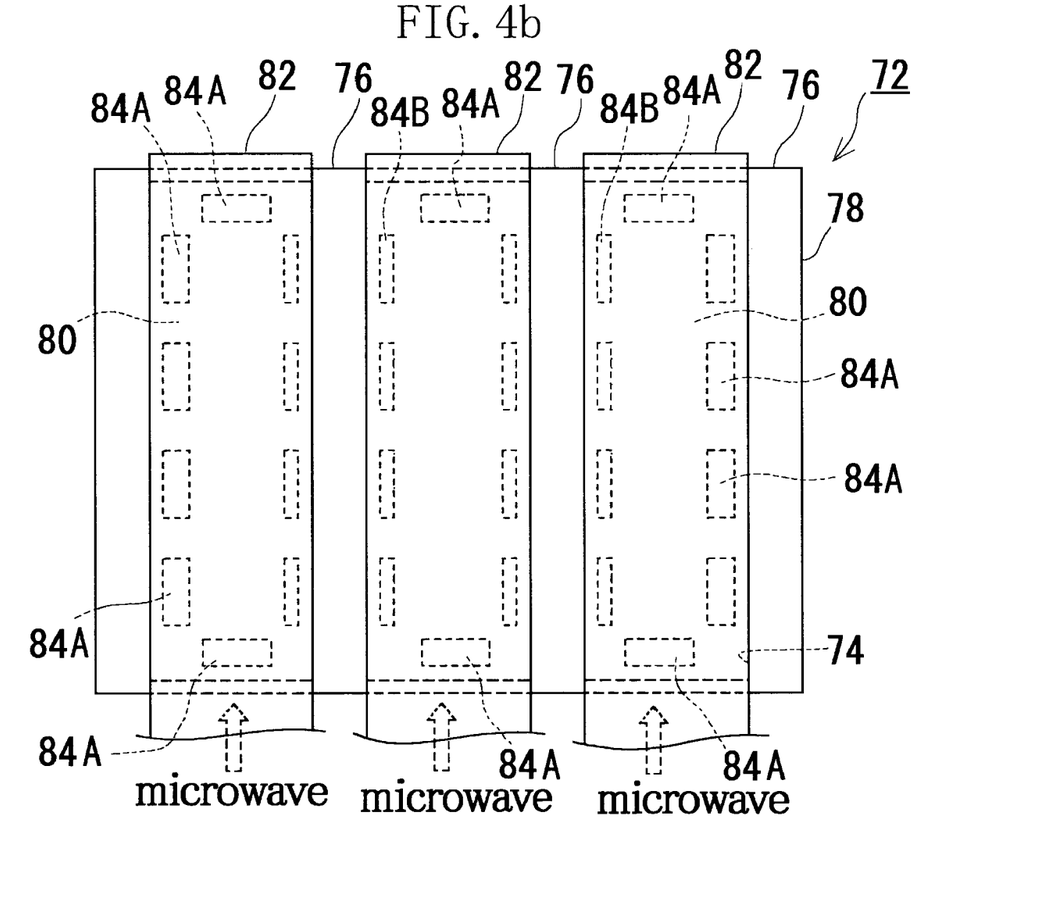

Referring to FIGS. 4a and 4b, another plasma processing apparatus 72 is shown. The plasma processing apparatus 72 comprises: a plasma generating chamber 78 to which a window frame 76 having three openings 74 of a rectangular planar shape parallel to each other are attached; and three dielectric members 80 having four sides of a rectangle attached so as to keep the sealing property (air-tightness). Incidentally, the window frame 76 forms a part of the plasma generating chamber 78.

Three wave guides 82 are disposed respectively in correspondence to the three dielectric members 80. Each wave guide 82 has a rectangular cross-sectional shape.

Each wave guide 82 has a plurality of holes 84A, 84B with four sides of a rectangle-like shape. Each of the holes 84A, 84B is located near the periphery of the dielectric member 80, and the long sides of each holes 84A, 84B are parallel to one side of the dielectric member 80 close thereto. In the illustration, the wave guide 82 having a rectangular cross-sectional shape, the open plane of the holes 84A, 84B are perpendicular to the wave plane of the electric field within the wave guide 82 and parallel to the wave plane of the magnetic field.

This makes the electric field of the microwave radiated from the holes 84A, 84B perpendicular to the boundary plane between the window frame 76 and the dielectric member 80. Also, influence of absorption of the microwave by the window frame 76 at the periphery of the dielectric member 80 is reduced. The size of the hole 84A to uniform the plasma density can be obtained by the hole area adjusting means in FIG. 1.

In the embodiment shown in FIGS. 4a and 4b, all the holes 84A close to the inner wall of the plasma generating chamber 78 have larger hole areas than the other holes 84B not close thereto, thereby they can reduce the lowering of the plasma density in the neighborhood of the inner wall of the plasma generating chamber 78. As a result, the plasma density in the plasma generating chamber is uniformed.

Figure 5:
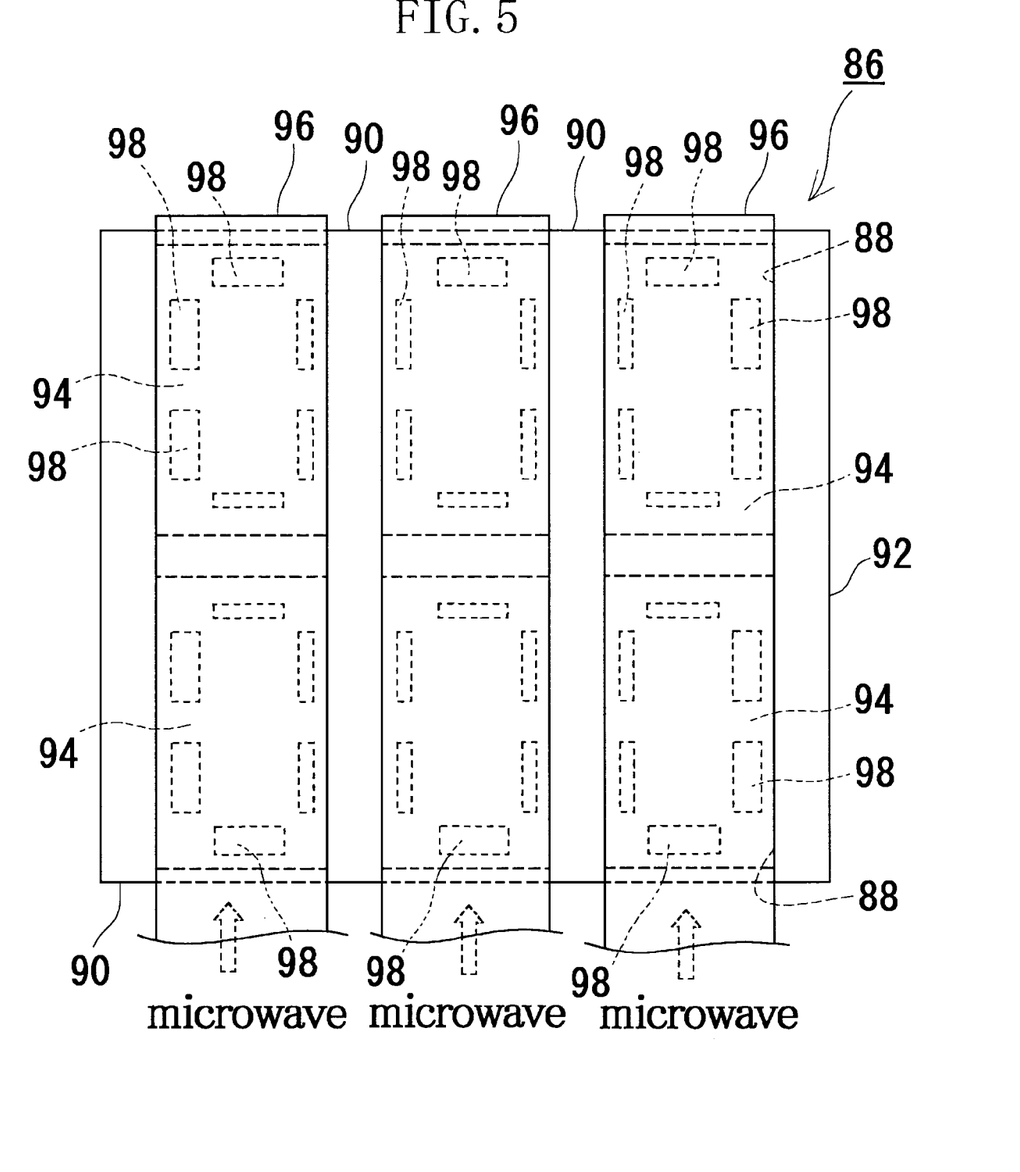
FIG. 5 is a plan view schematically showing another embodiment of the other plasma processing apparatus according to the present invention.

As shown in FIG. 5, the plasma processing apparatus 72 having a plurality of openings 74 parallel to each other can be replaced with another plasma processing apparatus 86 having a plurality of openings 88. The plasma processing apparatus 86, like the embodiment shown in FIG. 4, comprises a plasma generating chamber 92 to which a window frame 90 with six rectangular openings 88 is attached, and six dielectric members 94 having four sides of a rectangle respectively attached to the six openings of the window frame 90 so as to keep the air-tightness. Incidentally, the window frame 90 forms a part of the plasma generating chamber 92.

In the illustration, wave guides 96 in contact with the dielectric member 94 extending in the direction of the long sides of two openings 88 are disposed. Each wave guide 96 has a rectangular cross-sectional shape.

Each wave guide 96 has a plurality of holes 98 having four sides of a rectangle-like shape. Each hole 98 is located near the periphery of the dielectric member 94, and the long sides of each hole 98 is parallel to one side of the dielectric member 94 in contact with the long sides of each hole 98. This reduces the influence of absorption of the microwave by the window frame 90.

The numbers of the holes 84 and 98 are not limited to the above explanation but can be selected to suit the size of the plasma generating chamber and the dielectric member. In the above embodiment, as the hole area adjusting means 18, an example of adjusting the opening area of one hole 38, 46, 70 or 98 was given, but it is possible to form a number of small holes and operate to close the holes one by one to adjust the plasma density to be uniform. Further, as the hole area adjusting means 18, though an example of reciprocating the plate-like portion 18A was explained, the motion also includes forward and backward motion, rotating motion, etc.

According to the above embodiments, as a result of comprising the hole area adjusting means at least for one hole, a radiation amount of the electromagnetic wave energy from the at least one hole can be adjusted.

By this adjustment, the plasma density of a part of the space in the plasma generating chamber is increased or decreased, and the dispersion of the plasma density in the plasma generating chamber is reduced. Also, by adjusting the plasma density, the variation of the radiation amount of the electromagnetic wave energy from the holes can be adjusted according to the kind of a gas element introduced into the plasma generating chamber. Consequently, in the present invention, a specific chamber of a specific shape is not required.

When the hole having the hole area adjusting means has a larger hole area than those of the other holes, the opening area of the hole having the largest area and close to the inner wall of the chamber is adjusted by the hole area adjusting means, extinction of the plasma near the inner wall of the plasma generating chamber is compensated, and a difference in plasma density around the center of the chamber and near the inner wall can be made small.

By locating the hole having the largest hole area at the terminal end side of the wave guide, influence of reflection of the electromagnetic wave at the terminal end side of the wave guide can also be controlled.

When the wave guide includes a plurality of wave guides, a dispersion of the plasma density can be made much smaller.

When at least one of the holes is located near the periphery of the dielectric member, extinction of the plasma near the periphery of the dielectric member can be compensated.

When the wave guide has a rectangular cross-sectional shape, when the hole has four sides of a rectangle-like shape, and when the long sides of the hole are parallel to one side of the dielectric member close thereto, a loss of the electromagnetic energy in the neighborhood of the periphery of the dielectric member can be reduced, and more electromagnetic energy can be introduced into the plasma generating chamber.

When the hole area of the hole on the side of the chamber side wall is given the largest hole area and this hole is provided with the hole area adjusting means, a dispersion of the plasma density can be made much smaller.

When the hole area adjusting means is provided so as to adjust the opening area of the hole by reciprocating the metal plate-like portion, the hole area can be adjusted so that the dispersion of the plasma density may become much smaller.

According to another embodiment, since one side of the hole is parallel to one side of the dielectric member, it is possible to make the electric field of the microwave radiated from the hole perpendicular to a plane between the chamber and the dielectric member thereby to reduce the influence of absorption of the microwave by the chamber in the periphery of the dielectric member. This enables to lead the microwave sufficient for plasma generation into the chamber, and to generate a uniform and stable plasma inside the chamber.

By generation of such uniform and stable plasma, it is possible to control a plasma condition regardless of the kind of a gas element introduced into the plasma generating chamber.

When at least one hole located near one of adjacent two sides of the dielectric member and at least one hole located near the other of the two sides are included, when the long sides of the hole located near the one of the two sides are parallel to the one, and when the long sides of the hole located near the other of the two sides are parallel to the other, influence of absorption of the microwave in the periphery of the dielectric member can be more reduced.

What is claimed is:

1. A plasma processing apparatus comprising:
    a chamber defining at least one opening and constructed for retaining a generated plasma;
    a dielectric member positioned to sealingly cover the at least one opening;
    at least one wave guide provided exteriorly of the chamber such that one end side thereof opposes the dielectric member;
    an electromagnetic wave source operatively coupled to the at least one wave guide;
    a plurality of holes defined by a side of the at least one wave guide that is in opposition to the dielectric member; and
    hole area adjusting means including a reciprocatable plate portion provided in at least one, but not all, of the plurality of holes to adjust the opening area of the at least one hole and thereby modulate the waveform of a propagating wave during operation thereof.

2. A plasma processing apparatus according to claim 1, wherein at least one hole having the hole area adjusting means has a larger area than the areas of at least some of the other holes.

3. A plasma processing apparatus according to claim 2, wherein the hole having the larger hole area is located on the terminal end side of the wave guide.

4. A plasma processing apparatus according to claim 1, wherein the at least one wave guide includes a plurality of wave guides.

5. A plasma processing apparatus according to claim 1, wherein at least one of the holes is located near the periphery of the dielectric member.

6. A plasma processing apparatus according to claim 1, wherein the at least one wave guide has a rectangular cross-sectional shape, the at least one hole has four sides of a rectangular shape, the dielectric member has four sides of a rectangular shape, and wherein the long sides of the at least one hole are parallel to one side of the dielectric member close thereto.

7. A plasma processing apparatus according to claim 1, wherein a hole area of a hole adjacent a side wall surface side of the chamber is made the largest, and wherein said hole is provided with the hole area adjusting means.

8. A plasma processing apparatus according to claim 1, wherein the hole area adjusting means is provided with a metal plate-like portion so as to adjust the opening area of the hole by reciprocating the plate-like portion.

* * * * *